(12) United States Patent
Talmaki et al.

(10) Patent No.: US 10,504,372 B2
(45) Date of Patent: Dec. 10, 2019

(54) SYSTEM AND METHOD FOR DETECTION OF LOAD AND DUMP LOCATIONS

(71) Applicant: Caterpillar Inc., Peoria, IL (US)

(72) Inventors: Sanat A. Talmaki, Watertown, MA (US); Jason L. Smallenberger, Morton, IL (US)

(73) Assignee: Caterpillar Inc., Peoria, IL (US)

( * ) Notice: Subject to any disclaimer, the term of this patent is extended or adjusted under 35 U.S.C. 154(b) by 184 days.

(21) Appl. No.: 15/837,105

(22) Filed: Dec. 11, 2017

(65) Prior Publication Data

US 2019/0180627 A1    Jun. 13, 2019

(51) Int. Cl.
*G08G 1/00* (2006.01)
*B65B 1/28* (2006.01)
(Continued)

(52) U.S. Cl.
CPC .............. *G08G 1/20* (2013.01); *B23B 3/10* (2013.01); *B23B 29/04* (2013.01); *B23Q 3/155* (2013.01);
(Continued)

(58) Field of Classification Search
CPC ........... H01L 21/67784; H01L 21/6773; H01L 21/67736; H01L 21/67733; B65B 1/28; B65B 13/18; B65B 13/188; B65B 13/327; E02F 3/438; E02F 3/439; E02F 9/264; B23Q 3/155; B23Q 3/15513; B23B 3/10; B23B 29/04; B23B 29/244; B23B 31/261; B23B 31/268; G08G 1/20; G08G 3/02; G08G 1/202; G08G 7/02; G08G 3/00; B65G 51/03; B65G 67/00; B27C 7/005; B27C 7/06; B27M 1/08; B27M 3/18; E02D 27/52; E02D 29/06; E02D 37/00; G01S 5/16; G06Q 10/083; G01G 19/08; G01G 19/024; G01G 7/06; G05D 1/0206; G07C 5/008; G07C 5/08; G01L 1/06; G01L 1/14
See application file for complete search history.

(56) References Cited

U.S. PATENT DOCUMENTS 4,038,740 A * 8/1977 Grinage .................... B23B 3/10
                                                       483/26
7,181,370 B2   2/2007 Furem et al.
(Continued)

FOREIGN PATENT DOCUMENTS

WO        20050101271       10/2005

*Primary Examiner* — Behrang Badii

(57) ABSTRACT

A system for detecting a load location and a dump location at a worksite is provided. The system includes a controller coupled to a position detection module and a speed detection module. The controller receives a position signal and a speed signal associated with the machine. The controller identifies a load location based on a relative distance between the machine and a loading tool and the speed of the machine. The controller monitors a velocity of the machine as the machine moves away from the identified load location, gathers data related to a plurality of stops made by the machine, and builds a heuristic model. The controller selects one stop from the plurality of stops as a dump location based on a distance between the respective dump location and the load location, a duration of stopping of the machine, and a confidence score associated with the respective dump location.

20 Claims, 3 Drawing Sheets

(51) Int. Cl.
    *B27C 7/00*     (2006.01)
    *B65G 51/02*     (2006.01)
    *B23Q 3/155*     (2006.01)
    *B23B 29/04*     (2006.01)
    *E02F 3/43*     (2006.01)
    *B25J 11/00*     (2006.01)
    *E02F 3/42*     (2006.01)
    *H01L 21/677*     (2006.01)
    *B23B 3/10*     (2006.01)
    *B65B 13/18*     (2006.01)

(52) U.S. Cl.
    CPC ............... *B25J 11/00* (2013.01); *B27C 7/005* (2013.01); *B65B 1/28* (2013.01); *B65B 13/18* (2013.01); *B65G 51/02* (2013.01); *E02F 3/42* (2013.01); *E02F 3/43* (2013.01); *E02F 3/438* (2013.01); *E02F 3/439* (2013.01); *H01L 21/677* (2013.01); *H01L 21/67784* (2013.01)

(56) References Cited

U.S. PATENT DOCUMENTS

| | | | |
|---|---|---|---|
| 2002/0079022 A1* | 6/2002 | Colle | B23Q 3/155 144/382 |
| 2003/0115779 A1* | 6/2003 | Satzler | E02F 3/438 37/348 |
| 2003/0230058 A1* | 12/2003 | Nix | B65B 1/28 53/582 |
| 2013/0030876 A1 | 1/2013 | Rinehart et al. | |
| 2013/0304545 A1 | 11/2013 | Ballew et al. | |
| 2015/0112769 A1 | 4/2015 | Collins | |
| 2016/0111310 A1* | 4/2016 | Koike | H01L 21/67784 414/217 |
| 2016/0225106 A1 | 8/2016 | Shike | |

* cited by examiner

SYSTEM AND METHOD FOR DETECTION OF LOAD AND DUMP LOCATIONS

TECHNICAL FIELD

The present disclosure relates to a worksite monitoring system, and more specifically, to a system and method for detecting load and dump locations at a worksite.

BACKGROUND

A variety of machines, such as loaders and haulers, operate at a worksite. During operation, based on tasks assigned to the machines, a geography of the worksite may change on a regular basis. This may cause a location of load zones and dump zones to correspondingly change based on the variations in the topography.

It may be challenging to track and monitor activities of all machines operating at the worksite for monitoring changes in operations at the worksite, and for tracking loading and hauling events at the worksite. This in turn may make it difficult to accurately track productivity of the machines. Further, some systems depend upon knowledge of load and dump locations to compute number of events or cycles. It may be difficult to obtain such information beforehand. Moreover, sometimes, mixed fleets of machines operate at the worksite, making it difficult to obtain detailed system information for accurately tracking activities of these machines at the worksite. Currently known systems have many hardware components and require a lot of information to operate, making these systems difficult to install, cumbersome, and expensive.

United States Published Application Number 2013/0304545 describes a system for integrated asset management. Information from a first reporting source about an asset is received. In addition, information is received about the asset from a second reporting source. Inspection information about the asset is received from a first enabled device. A database is then populated with the information from the first reporting source, the information from the second reporting source, and the inspection information from the first enabled device, such that the information from the first reporting source, the information from the second reporting source, and the inspection information from the first enabled device can be collected or accessed in an integrated manner from the database for use by a client information system.

SUMMARY OF THE DISCLOSURE

In one aspect of the present disclosure, a system for detecting a load location and a dump location at a worksite is provided. The system includes a position detection module associated with a machine. The position detection module is configured to generate a position signal indicative of a position of the machine at the worksite. The system includes a speed detection module associated with the machine. The speed detection module is configured to generate a speed signal indicative of a speed of the machine. The system includes a controller coupled to the position detection module and the speed detection module. The controller is configured to receive the position signal indicative of the position of the machine and receive the speed signal indicative of the speed of the machine. The controller is configured to identify a load location on the worksite based on a relative distance between the machine and a loading tool and the speed of the machine. The controller is configured to monitor a velocity of the machine as the machine moves away from the identified load location and gather data related to a plurality of stops made by the machine. The controller is configured to build a heuristic model and select one stop from the plurality of stops as a dump location based on a distance between the respective dump location and the load location, a duration of stopping of the machine, and a confidence score associated with the respective dump location.

In another aspect of the present disclosure, a method for detecting a load location and a dump location at a worksite is provided. The method includes receiving, by a controller, a position signal indicative of a position of a machine. The method includes receiving, by the controller, a speed signal indicative of a speed of the machine. The method includes identifying, by the controller, a load location on the worksite based on a relative distance between the machine and a loading tool and the speed of the machine. The method includes monitoring, by the controller, a velocity of the machine as the machine moves away from the identified load location. The method includes gathering, by the controller, data related to a plurality of stops made by the machine. The method includes building a heuristic model and selecting, by the controller, one stop from the plurality of stops as a dump location based on a distance between the respective dump location and the load location, a duration of stopping of the machine, and a confidence score associated with the respective dump location.

Other features and aspects of this disclosure will be apparent from the following description and the accompanying drawings.

DETAILED DESCRIPTION

Figure 1:
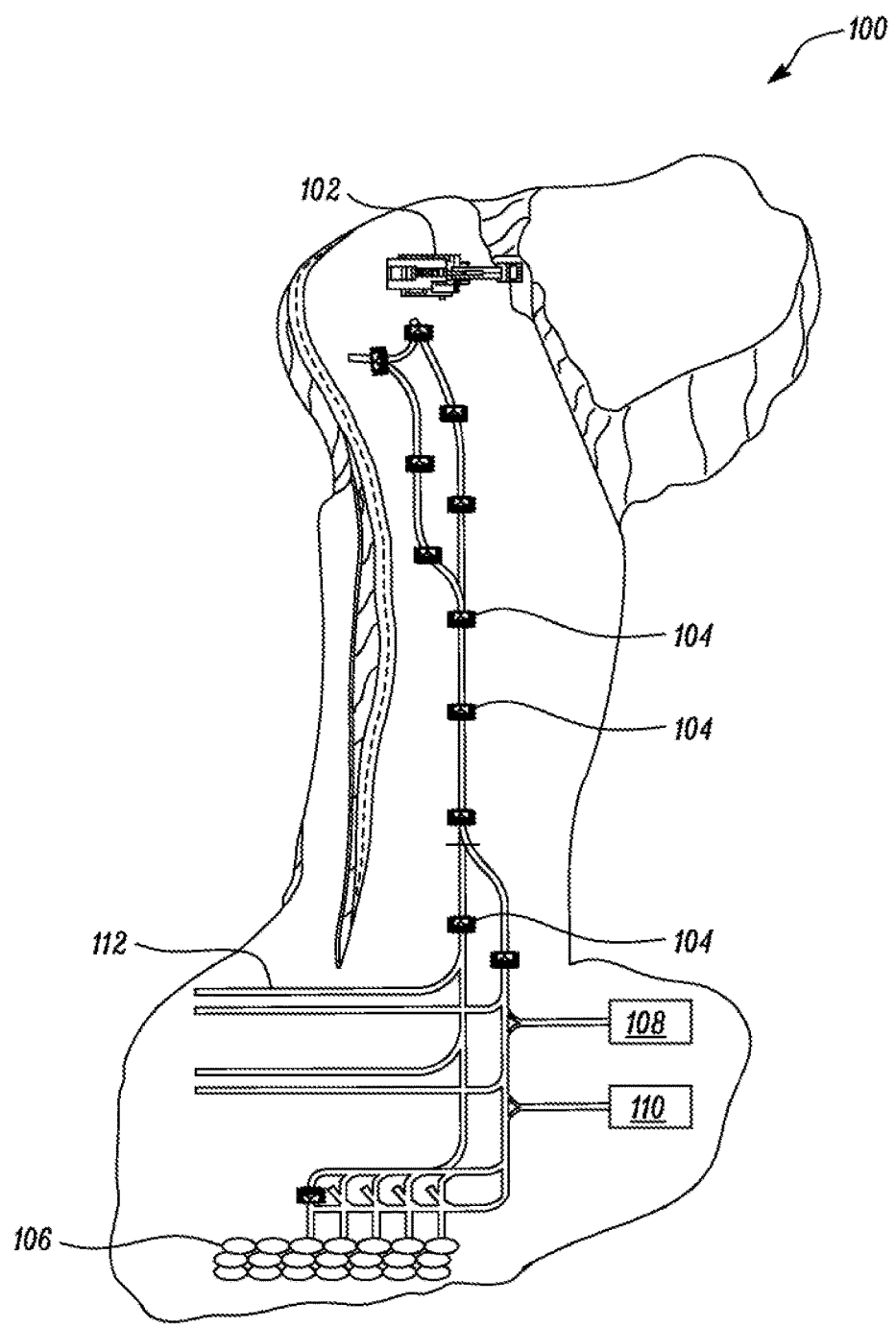
FIG. 1 is a schematic view of an exemplary worksite, in accordance with the concepts of the present disclosure.

FIG. 1 illustrates an exemplary worksite 100 which, in the present example, is a mine worksite. A number of machines 102, 104 operate at the worksite 100. In this instance the machines 102, 104 depicted comprise a loading machine or loading tool 102 (hereinafter interchangeably referred to as machine 102) and a hauler 104 (hereinafter interchangeably referred to as machine 104). For example, the loading tool 102 may be an excavator, a wheel loader, or other loading machine, and the hauler 104 may be an articulated dump truck, an off-highway truck, or any other hauler. The machines 102, 104 operating at the worksite 100 may be directly controlled by human operators, remotely controlled by human operators, be autonomous machines capable of autonomously working and traversing the worksite 100, or be semi-autonomous machines configured to perform some functions autonomously and other functions under the control of an operator.

The worksite 100 also comprises a number of locations designated for particular purposes. In this example the locations comprise: a load location 104 is designated as a location at which the loading tool 102 or other resource operates to fill the hauler 104 with material; a dump location 106 designated as a location at which the hauler 104 discards collected material; a re-fueling location 108 designated as a location which mobile machines can attend to be re-fueled; and a maintenance location 110 designated as a location which the mobile machines can attend to be maintained. The worksite 100 also comprises designated roads or paths 112 (which may have multiple lanes) linking various worksite locations and along which the mobile worksite machines can travel.

Over the course of worksite operations, the machines 102, 104 are assigned with a variety of tasks at the worksite 100. Such tasks comprise tasks directed at altering the geography of the worksite 100 and/or recovering material from the worksite. For example, the loading tool 102 may be assigned the task of loading the hauler 104 with material at the load location 104, the hauler 104 may be assigned with the tasks of attending the load location 104, receiving a load of material from the loading tool 102, attending the dump location 106, dumping the material received from the loading tool 102, and repeating.

It will be appreciated that the types of machines 102, 104 and the designated locations 104, 106, 108, 110 and the tasks described above are by way of illustration only. The worksite 100 may have additional (or fewer) machines 102,104, different types of machines, different designated locations, and/or different task assignments. A geographic position of the load and dump locations relative to the worksite 100 may keep changing based on the tasks assigned to the machines 102, 104. The present disclosure relates to a worksite monitoring system 200 (see FIG. 2) for monitoring activities of the machines 102, 104 at the worksite 100 and for determining the load and dump locations at the worksite 100. The worksite monitoring system 200 can be used to determine the load and dump locations for a mixed fleet of machines without any limitation.

Figure 2:
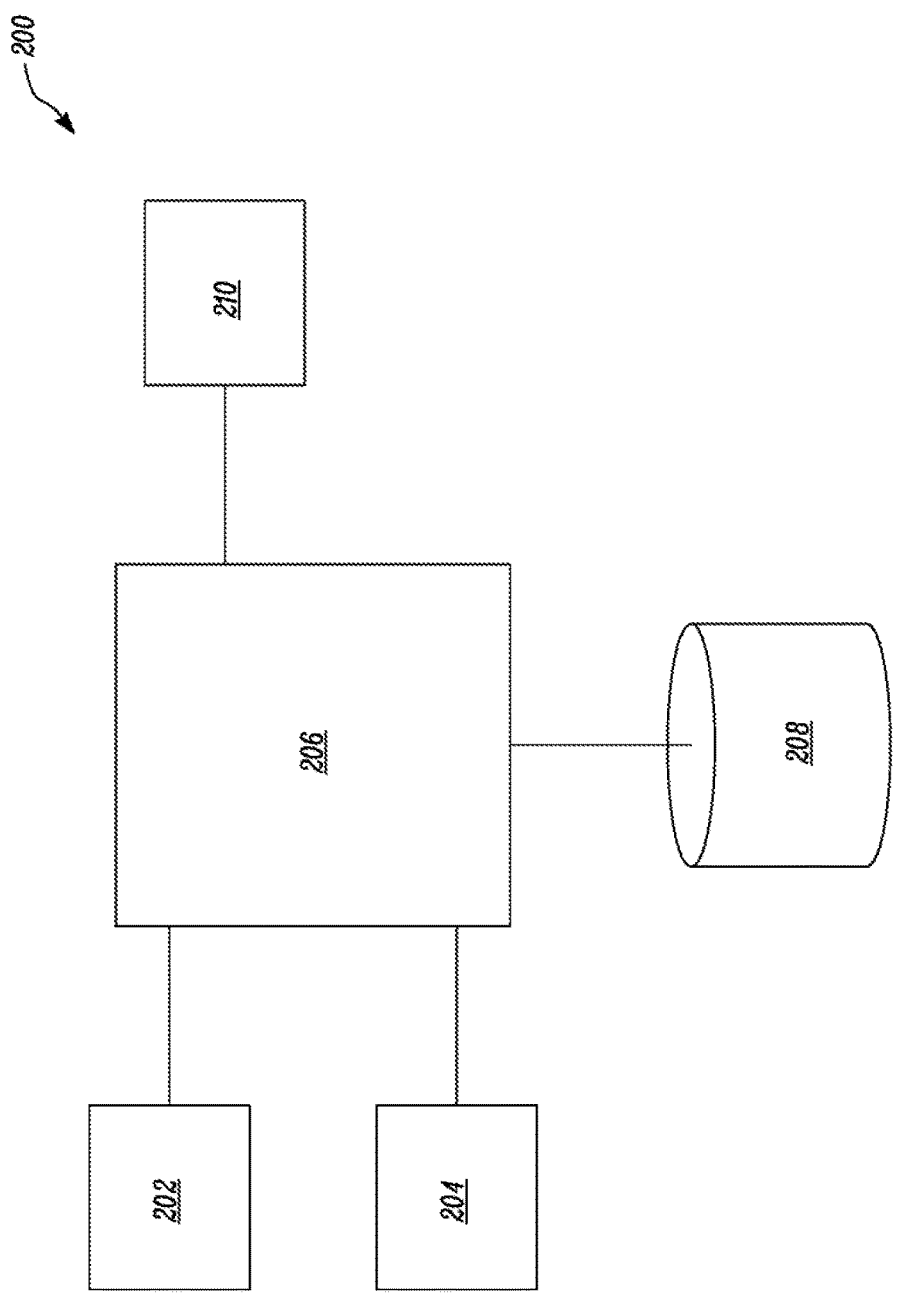
FIG. 2 is a block diagram of a worksite monitoring system for the worksite of FIG. 1, in accordance with the concepts of the present disclosure.

Referring to FIG. 2, the worksite monitoring system 200 includes a position detection module 202 provided on each of the machines 102, 104. The position detection module 202 is configured to generate a position signal indicative of the position of the machine 102, 104 at the worksite 100. The position detection module 202 may include a GPS unit or any other known device for detecting the position of the machine 102, 104 at the worksite 100.

The worksite monitoring system 200 also includes a speed detection module 204 associated with the machine 102, 104. The speed detection module 204 is configured to generate a speed signal indicative of a speed of the machine 102, 104. The speed detection module 204 may include any known sensor or module for determining the ground speed of the machine 102, 104. For example, the speed detection module 204 may include a speed sensor connected to the axle of the machine 102, 104 for measuring the ground speed of the machine 102, 104. Alternatively, the speed detection module 204 may determine the speed of the machine 102, 104 using any other known technique.

The worksite monitoring system 200 includes a controller 206 coupled to the position detection module 202 and the speed detection module 204. The controller 206 is configured to determine the load and dump locations at the worksite 100 based on the data received from the position detection module 202 and the speed detection module 204 by building a heuristic model as will be described in detail below. The controller 206 receives the position signal from the position detection module 202 and the speed signal from the speed detection module 204.

For building the heuristic model, the controller 206 identifies the load location at the worksite 100 based on the relative distance between the loading tool 102 and the hauler 104. More particularly, the controller 206 is configured to identify the type of the machine as the loading tool 102 or the hauler 104 based on an identification code associated with the respective machine 102, 104. In one example, the controller 206 may determine the identification code based on a signal received from an electronic control module (ECM) of the respective machine 102, 104.

For any given pair of the loading tool 102 and the hauler 104, the controller 206 determines the distance between the loading tool 102 and the hauler 104 for which the both the machines 102, 104 have stopped for a predetermined time duration during which the hauler 104 may get filled with the material. For example, the controller 206 compares timestamps received from the loading tool 102 and the hauler 104 and checks for an overlap to determine if the two machines were at halt at the same time. The controller 206 may receive the speed data from the machines at regular intervals, allowing the controller 206 to determine if the machines were at halt at the same time. The heuristic may consider two events as occurring simultaneously if the two events occur within 60 seconds of each other. This may vary based on a sampling frequency of the data capture.

It should be noted that since data points may not be sampled at the exact same second within a minute, the heuristic built by the controller 206 computes delta between the two timestamps and does not just check for matching minutes in HH:MM:SS. The overlap duration can be decreased if data sampling rate is increased. However, increasing the overlap duration larger than 60 seconds may result in non-simultaneous events being incorrectly considered happening at the same time of one another. For example, if the timestamp of the loading tool 102 is 18:06:44, and the timestamp of the hauler 104 is 18:07:14, the heuristic computes the delta between these two events as 30 seconds and consider them "matching" or happening simultaneously.

Further, the controller 206 may determine the proximity of the two machines, along with the time duration for which the machine slowed down or stopped. In one embodiment, for all data points that are matching in time, the heuristic built by the controller 206 computes proximity between the loading tool 102 and hauler 104 using haversine formula. In some cases, the speed data sent to the controller 206 from the position detection module 202 may have limited resolution.

The controller 206 is coupled to a database 208. The database 208 may be any known data storage medium, memory device, or data repository. The controller 206 may access and retrieve the predetermined threshold distance from the database 208. In one example, the predetermined distance threshold may be approximately between 11 m and 15 m. It should be noted that if the heuristic picks too large of a distance threshold, say more than approximately between 11 m and 15 m, then the haulers 104 that are queuing behind the actual machine getting loaded may also end up being within the predefined proximity. This will result in multiple machines 104 being reported as undergoing loading events, and will thus require additional post-processing in order to enforce a one-to-one logic between the loading tool 102 and the hauler 104 at any given instant. However, at the same time, choosing a distance threshold (radius) that is too small will result in no loading events being detected as the hauler 104 and the loading tool 102 will never be close enough to satisfy the heuristic's requirement.

In some cases, during the loading event which can last from as little as say 60 seconds to around two or three minutes, the distance and time thresholds will be satisfied for a number of consecutive minutes. However, sometimes the duration of the loading cycle from the perspective of the loading tool 102 may be different from this. When deployed into production, the duration of the loading event may be user adjustable to match up correctly to the operation the operator is running. Sometimes, the heuristic may take into account multiple timestamps for a single loading event, and may thus need to filter out some data points. In order to accomplish this filtering, the heuristic may consider events having the same loading tool 102 and hauler 104 machine combination occurring within a certain time delta of one another, picking only the first timestamp from such a series while rejecting the rest of the multiple timestamps. The filter applied by the heuristic may also recognize a different loading tool 102 and hauler 104 machine combination occurring within the set time threshold and count such events as unique and not part of the series preceding it.

The controller 206 identifies the load location at the worksite 100 based on the identification of the loading event taking place at the respective load location at the worksite 100. The controller 206 may gather data from multiple machines and a number of machine cycles to determine a load zone at the worksite 100, such that the load zone is an area at the worksite 100 at which multiple loading operations take place. The controller 206 monitors the activities of multiple machines at the worksite 100 over a specifies time period, associates a confidence score with the given load location or the load zone, and builds confidence in this identification based on the monitored activities of the multiple machines.

The controller 206 then monitors a velocity of the hauler 104 as the hauler 104 moves away from the identified load location. More specifically, as the hauler 104 moves away from the load location, the controller 206 monitors the velocity of the hauler 104 to determine all locations at the worksite 100 where the hauler 104 stopped or was slow enough for a consecutive period of minutes long enough to be able to perform a potential dump event. Parameters used to detect the dump event may be a speed of approximately 5 miles per hour speed threshold and a distance threshold of approximately 15 m over the duration of time between the two consecutive timestamps. These values may be retrieved by the controller 206 from the database 208. A person of ordinary skill in the art will appreciate that these values are exemplary and may vary. The duration can be assumed to be nominally equal to approximately one minute but may vary from this value due to variations in sampling time per minute.

For example, the controller 206 monitors the speed of the hauler 104 as it moves away from the load location and gathers and records all locations at which the hauler 104 moves slower than 5 mph and covers less than 15 meters over consecutive minutes as stops that may be considered as dump location candidates. As would be expected, the number of stops made by the machine is >1 and the false positives are filtered out by the controller 206 using filters described in the following steps. A person of ordinary skill in the art will appreciate that the ranges described herein are exemplary and do not limit the scope of the present disclosure.

The controller 206 further selects one stop from the multiple stops made by the hauler 104 on a route away from and back towards the load location based on a distance between the respective dump location and the load location, a duration of stopping of the machine, and a confidence score associated with the respective dump location. In one embodiment, the controller 206 initially computes the distance of the potential dump location from the identified load location. It should be noted that the speed and motion of the hauler 104 during the load events and the dump events are very similar without the help of any other contextual information, that is under both the load and dump events, the hauler 104 has stopped (or is traveling very slowly) for a consecutive period of minutes.

However, at the load location, the loading tool 102 is proximate to the hauler 104, but this does not hold true at the dump location. Thus, it is essential for the heuristic to consider only those points that are likely to be dump locations but are most certainly not load events. In majority of load-haul applications, the minimum distance traveled by the hauler 104 is at least approximately 500 feet (160 m) away from the identified load location or loading tool 102 location. Thus, the heuristic computes the distance of all data points that pass the speed and/or distance threshold filter and computes the respective distance from the load location associated with the load event that occurred just prior to it.

The controller 206 needs to select one stop from the multiple stops as the dump location since. All stops or dump location candidates that are within this predetermined distance threshold from the load location are not considered as these may be likely to be from queuing and/or slowing down prior to reaching the load zone. The stops that pass this filter are considered as potential dump locations. The selection of the potential dump locations may vary from site to site. In one example, the controller 206 selects the farthest stop away from the load location as the dump location and discards all subsequent stops made by the hauler 104. In other embodiments, the controller 206 associates a confidence score with the given dump location. The controller 206 gathers data from multiple machines operating at the worksite 100 and builds confidence in the identified dump location. Further, the controller 206 may identify a dump zone based on the dump locations that are determined by the controller 206 for different machines.

In another example, similar to the load location filtering performed by the controller 206, for removing repeating events occurring in a series, if the hauler 104 slows down and stops for consecutive minutes, the controller 206 will count each and every point that satisfies the speed and distance thresholds. Alternatively, the controller 206 may filter out repeating or duplicate potential dump locations or stops using any suitable combination of approaches: earliest or latest timestamp, farthest point from the load location, stops with the slowest speed, and/or the smallest distance covered from the load location.

In another example, the controller 206 may add a clustering filter in addition to the distance computation and time and/or speed filters, the heuristic will pick a point that is closer to an established cluster of the stops rather than a stray or isolated stop that is not part of a cluster. In this case, additional machine channels such as BED-UP status may further assist the controller 206 in accurately identifying the dump location for such higher complexity haul routes. In another embodiment, the controller 206 may correlate a number of the load locations and a number of the dump location for the hauler 104 to establish a 1:1 relationship for the haul route, that is, the heuristic correlates a single load event to its corresponding dump event. For example, if there are multiple load events and a single dump event following the multiple load events, one-to-one correspondence can be achieved by the controller 206 by establishing a rule for filtering out duplicate or repeating load locations. In one case, the controller 206 may select the earliest load event, the last load event, or the median load event based on the recorded timestamps. In another case, if there are multiple dump events following a load event, the controller 206 may use any other filtering criteria for maintaining the 1:1 relationship between the load locations and the dump locations.

In another scenario, there may be multiple load locations and multiple dump locations associated with a single cycle. In this case, the heuristic may enforce a strict non-duplicate policy at the load location determination step by selecting parameters such as proximity distance and time interval values for filtering duplicate or repeating stops that accurately matches up to the operation. Alternatively, the heuristic may run a number of parallel computations using different permutations of values for proximity detection and filtering events, allowing the user to select a result that most accurately resembles their operation. This option may be provided for worksites 100 that have not previously been processed by the system or at a start of a new shift on haul routes or locations that are previously unknown to the system. Once selected, the heuristic further discards the remaining permutations and continues with the selected location until the load and/or dump location changes by greater than a predetermined distance. The heuristic nature of the model allows the model to improve accuracy over time thus improving user confidence unlike that in static models.

The controller 206 is coupled to an output device 210. The output device 210 may include a screen, a monitor, a touch screen, or any other known output unit. The controller 206 may provide a notification of the identified load and dump locations through the output device 210. In one example, the controller 206 may provide a notification of the load and dump zones through the output device 210. The controller 206 may process the speed and position data on a real-time basis for dynamically identifying the load and dump locations. Alternatively, the controller 206 may process the speed and position data that are logged or recorded by the system. The controller 206 may be present at any suitable off-site location and is capable of processing the speed and position data from multiple machines. In one embodiment, the logic and functionality of the controller 206 may reside on multiple machines at the worksite 100 such that the machines may communicate with each other to identify the load and dump locations.

The controller 206 may be a microprocessor or other processor as known in the art. The controller 206 may embody a single microprocessor or multiple microprocessors to perform the operations described above. Numerous commercially available microprocessors may be configured to perform the functions of the controller 206. A person of ordinary skill in the art will appreciate that the controller 206 may additionally include other components and may also perform other functions not described herein.

INDUSTRIAL APPLICABILITY

Figure 3:
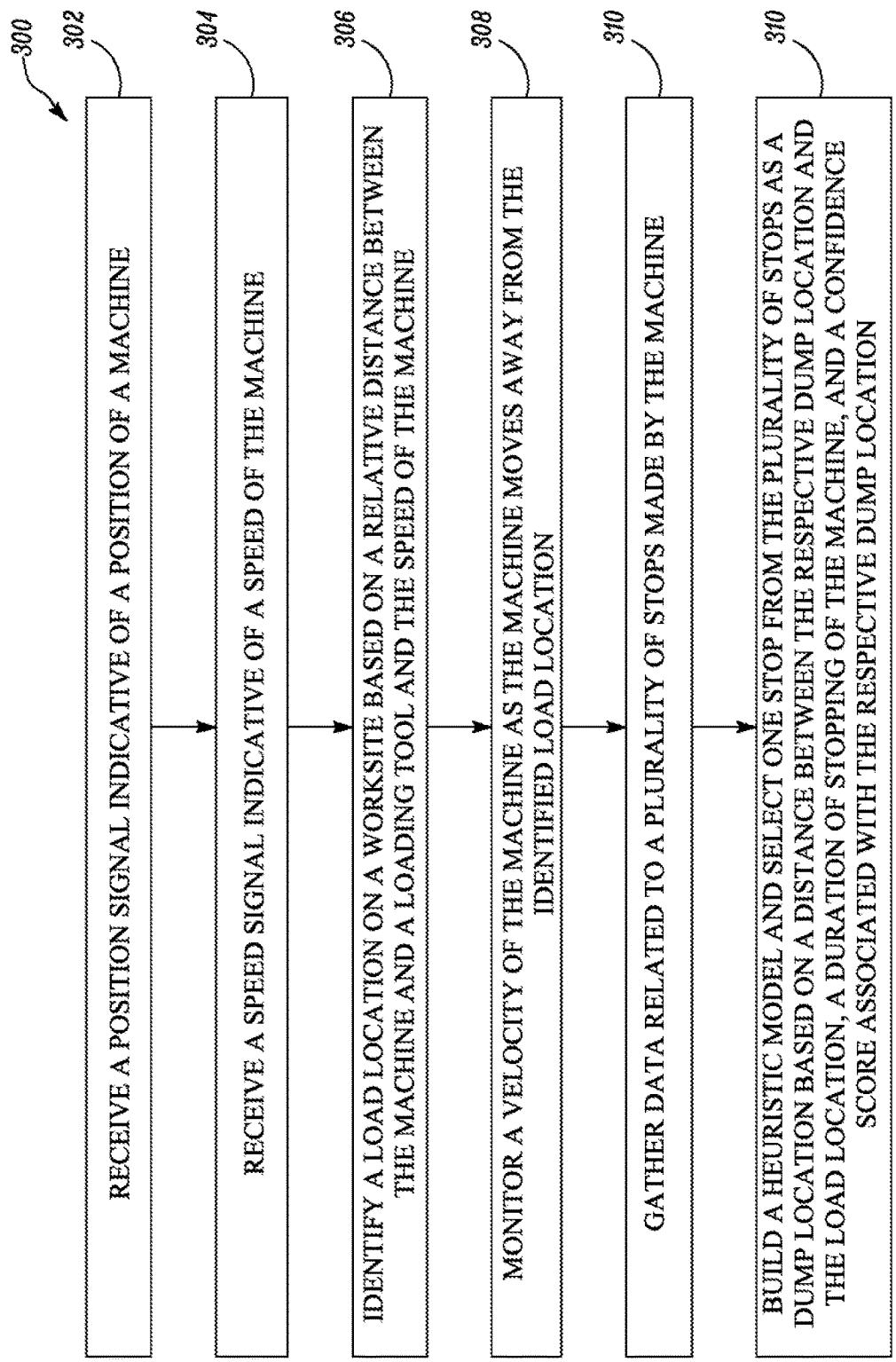
FIG. 3 is a flowchart of a method for detecting load and dump locations at the worksite, in accordance with the concepts of the present disclosure.

The present disclosure relates to the system 200 and method 300 for monitoring the activities at the worksite 100. Referring to FIG. 3, at step 302, the controller 206 receives the position signal indicative of the position of the machine 102, 104. At step 304, the controller 206 receives the speed signal indicative of the speed of the machine 102, 104. At step 306, the controller 206 identifies the load location on the worksite 100 based on the relative distance between the machine 104 and the loading tool 102 and the speed of the machine 104. At step 308, the controller 206 monitors the velocity of the machine 104 as the machine 104 moves away from the identified load location. At step 310, the controller 206 gathers data related to the plurality of stops made by the machine 104. At step 312, the controller 206 builds the heuristic model and selects one stop from the plurality of stops as the dump location based on the distance between the respective dump location and the load location, the duration of stopping of the machine 104, and the confidence score associated with the respective dump location.

The system provided by the present disclosure can be used to detect the load and dump locations for a mixed fleet of machines. Further, the system requires basic information including the speed and position of the machine 102, 104 for detecting the load and dump locations. The heuristic model built by the controller 206 can be used to build confidence and accurately identify the load zone and the dump zone by monitoring the activities of a number of the machines 102, 104. The system provides a cost-effective solution that can be easily deployed for accurately monitoring productivity of the machines 102, 104.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof.

What is claimed is:

1. A system for detecting a load location and a dump location at a worksite, the system comprising:
   a position detection module associated with a machine, the position detection module configured to generate a position signal indicative of a position of the machine at the worksite;
   a speed detection module associated with the machine, the speed detection module is configured to generate a speed signal indicative of a speed of the machine; and
   a controller coupled to the position detection module and the speed detection module, the controller configured to:
   receive the position signal indicative of the position of the machine;
   receive the speed signal indicative of the speed of the machine;
   identify a load location on the worksite based on a relative distance between the machine and a loading tool and the speed of the machine;
   monitor a velocity of the machine as the machine moves away from the identified load location;
   gather data related to a plurality of stops made by the machine; and
   build a heuristic model and select one stop from the plurality of stops as a dump location based on a distance between the respective dump location and the load location, a duration of stopping of the machine, and a confidence score associated with the respective dump location.

2. The system of claim 1, wherein the controller is further configured to identify a type of the machine as any one of the loading tool and a hauler.

3. The system of claim 1, wherein identification of the load location further includes:
   identifying a load zone in an area surrounding the load location and building a confidence score in the identified load location based on monitoring activities of a plurality of machines in the area.

4. The system of claim 1, wherein the relative distance between the machine and the loading tool for identification of the load location lies in a range between 11 m and 15 m.

5. The system of claim 1, wherein for selecting the one stop from the plurality of stops the controller is configured to identify a dump zone in an area surrounding the respective stop and build a confidence score in the respective stop based on monitoring activities of a plurality of machines in the area.

6. The system of claim 1, wherein the controller is configured to discard remaining stops from the plurality of stops that occur after the stop identified as the dump location.

7. The system of claim 1, wherein the controller is further coupled to an output device, such that the controller is configured to provide a notification of the identified load and dump locations.

8. The system of claim 1, wherein the controller is configured to identify the load and dump locations on a real-time basis.

9. The system of claim 1, wherein the controller is configured to determine if the respective stop from the plurality of stops is farthest from the identified load location.

10. The system of claim 1, wherein the controller is configured to correlate a number of the load locations and a number of the dump location for the machine.

11. A method for detecting a load location and a dump location at a worksite, the method comprising:
    receiving, by a controller, a position signal indicative of a position of a machine;
    receiving, by the controller, a speed signal indicative of a speed of the machine;
    identifying, by the controller, a load location on the worksite based on a relative distance between the machine and a loading tool and the speed of the machine;
    monitoring, by the controller, a velocity of the machine as the machine moves away from the identified load location;
    gathering, by the controller, data related to a plurality of stops made by the machine; and
    building a heuristic model and selecting, by the controller, one stop from the plurality of stops as a dump location based on a distance between the respective dump location and the load location, a duration of stopping of the machine, and a confidence score associated with the respective dump location.

12. The method of claim 11 further including identifying, by the controller, a type of the machine as any one of the loading tool and a hauler.

13. The method of 11, wherein identification of the load location further includes:
    identifying, by the controller, a load zone in an area surrounding the load location and building, by the controller, a confidence score in the identified load location based on monitoring activities of a plurality of machines in the area.

14. The method of claim 11, wherein the relative distance between the machine and the loading tool for identification of the load location lies in a range between 11 m and 15 m.

15. The method of claim 11, wherein selecting the one stop from the plurality of stops includes identifying, by the controller, a dump zone in an area surrounding the respective stop and building, by the controller, a confidence score in the respective stop based on monitoring activities of a plurality of machines in the area.

16. The method of claim 11 further including discarding, by the controller, remaining stops from the plurality of stops that occur after the stop identified as the dump location.

17. The method of claim 11 further including providing, by the controller, a notification of the identified load and dump locations through an output device.

18. The method of claim 11 further including detecting, by the controller, the load and dump locations on a real-time basis.

19. The method of claim 11 further including determining, by the controller, if the respective stop from the plurality of stops is farthest from the identified load location.

20. The method of claim 11 further including correlating, by the controller, a number of the load locations and a number of the dump location for the machine.

* * * * *